United States Patent [19]

Nankivil

[11] Patent Number: 4,473,796
[45] Date of Patent: Sep. 25, 1984

[54] RESISTANCE AND CAPACITANCE MEASURING DEVICE

[75] Inventor: Donald B. Nankivil, Santa Ana, Calif.

[73] Assignee: Ford Aerospace & Communications Corporation, Detroit, Mich.

[21] Appl. No.: 389,531

[22] Filed: Jun. 18, 1982

Related U.S. Application Data

[60] Division of Ser. No. 239,812, Mar. 2, 1981, , which is a continuation-in-part of Ser. No. 44,797, May 31, 1979, abandoned.

[51] Int. Cl.³ .................... G01R 27/00; G01R 27/26; G01R 31/26
[52] U.S. Cl. .................. 324/57 R; 324/60 C; 324/62; 324/158 D
[58] Field of Search ............. 324/158 D, 57 R, 60 C, 324/62

[56] References Cited

PUBLICATIONS

Monticelli et al., "Op-Amp Circuit Measures . . . ", Electronics, Jul. 10, 1975, pp. 112–113.

Primary Examiner—Ernest F. Karlsen
Attorney, Agent, or Firm—Edward J. Radlo; Robert D. Sanborn

[57] ABSTRACT

This circuit measures both the resistance and the capacitance of the parallel RC circuit that is the equivalent of any substantially non-inductive two-port device. Thus, the circuit can measure any resistance, capacitance, RC network, or diode, including photovoltaic diodes. The invention uses an operational amplifier, an audio A.C. oscillator and a voltage measuring device such as a digital RMS voltmeter. The resulting apparatus is small, inexpensive, accurate, and easy to operate. The resistance is measured with the audio oscillator set for a low frequency (such as 70 Hz); the capacitance is measured when the audio oscillator is set at a high frequency (such as 20 KHz). The resultant values can either be calculated using simple formulas or can be displayed directly using an analog or digital circuit.

1 Claim, 8 Drawing Figures

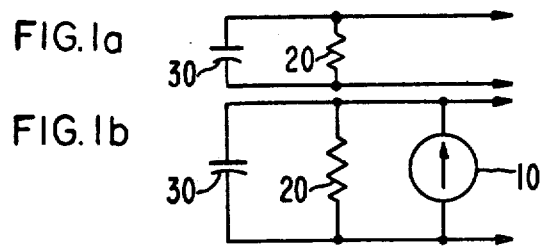
FIG.1a
FIG.1b
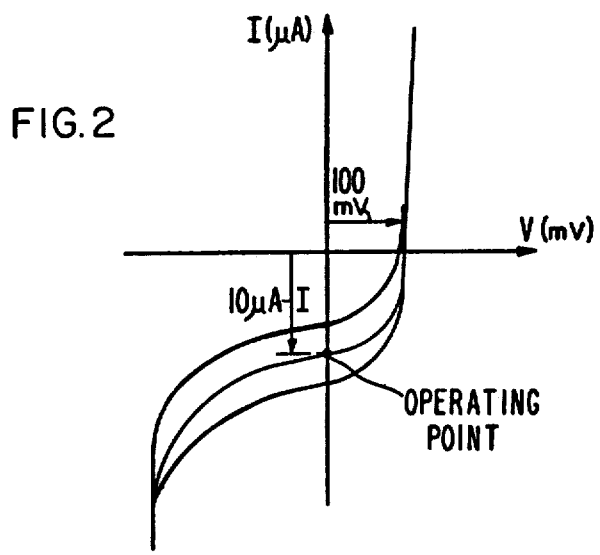
FIG.2
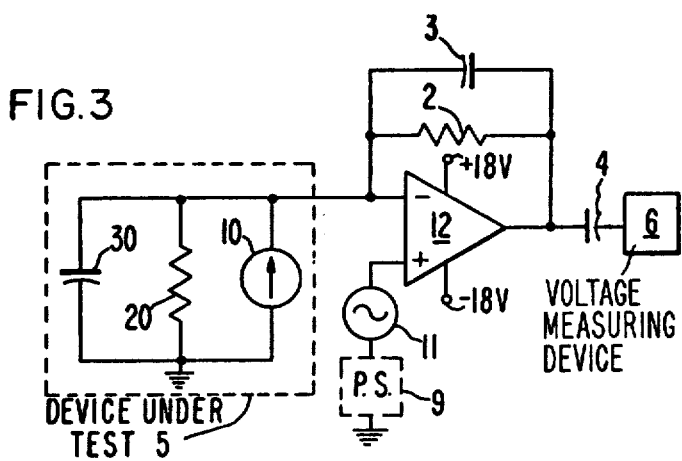
FIG.3

RESISTANCE AND CAPACITANCE MEASURING DEVICE

This is a division of application Ser. No. 239,812, filed Mar. 2, 1981, which is a continuation-in-part of application Ser. No. 044,797, filed May 31, 1979, now abandoned.

BACKGROUND OF THE INVENTION

1. Field of the Invention

This invention is an apparatus and method for measuring both the resistance and capacitance of the parallel RC circuit that is the equivalent of any substantially non-inductive two-port device.

2. Description of the Prior Art

U.S. Pat. No. 3,668,523 shows a device which measures the voltage dependent capacitance of a metal-insulator-semiconductor; however, this device cannot measure any resistance, such as the dynamic impedance of a photovoltaic diode, as does the present invention. Furthermore, this patent always uses a linear ramp voltage source. Because of this, the patentee requires an X-Y display device such as an oscilloscope to measure his voltage. This is more expensive as well as more difficult to read than in the present invention, where it is possible to use only an inexpensive easy-to-read digital meter to measure capacitance.

U.S. Pat. No. 3,387,211 discloses a complicated circuit which measures only the impedance of a diode.

U.S. Pat. No. 3,614,614 shows a method using a FET and an oscilloscope to measure only the capacitance of a diode.

U.S. Pat. No. 2,779,922 shows circuits using bulky transformers. FIG. 8 shows the use of variable capacitor 56 to measure collector capacitance of transistor 10.

U.S. Pat. No. 3,054,055 uses a bridge to measure resistance, figure of merit, and tangential sensitivity of a diode.

Monticelli et al, "Op-amp circuit measures diode-junction capacitance", *Electronics*, July 10, 1975, pp. 112-113; and Kaplan et al, "New method of continuously measuring differential capacitance changes", *Electronics Letters*, vol. 11, no. 15, pp. 333-334, July 24, 1975, measure certain capacitances but not resistances as in the present invention.

SUMMARY OF THE INVENTION

In the present invention an operational amplifier in non-inverting negative feedback mode is connected to the two-port device under test. The positive terminal of the op amp is connected to an audio frequency alternating voltage oscillator which is capable of operating at frequencies from 0 Hz up to around 25 KHz. Voltages are measured at the output terminal of the op amp with any AC meter which is AC coupled, such as an RMS meter. A known capacitance and a known resistance in parallel form the op amp negative feedback impedance. The resistive and capacitive parameters under measurement are functions of these known values of capacitance and resistance and of the voltages of the output and input sinusoids. The unknown resistance is measured with the oscillator set at a low input frequency, e.g., less than approximately 70 Hz, whereas the unknown capacitance is measured with the oscillator set at a high input frequency, e.g., greater than approximately 20 KHz. The invention can be implemented in either analog or digital circuitry.

BRIEF DESCRIPTION OF THE DRAWINGS

These and other more detailed and specific objects and features of the present invention are more fully disclosed in the following specification, reference being had to the accompanying drawings, in which:

FIG. 1a is a schematic diagram of the parallel RC model of any substantially non-inductive two-port device;

FIG. 1b, is a schematic diagram of the model of any photovoltaic diode;

FIG. 2 is an illustration of the current-voltage family of curves describing the characteristics of a photovoltaic diode;

FIG. 3 is a circuit diagram of the present invention in a simple embodiment wherein the device being measured is a photovoltaic diode;

DESCRIPTION OF THE PREFERRED EMBODIMENTS

Figure 4:
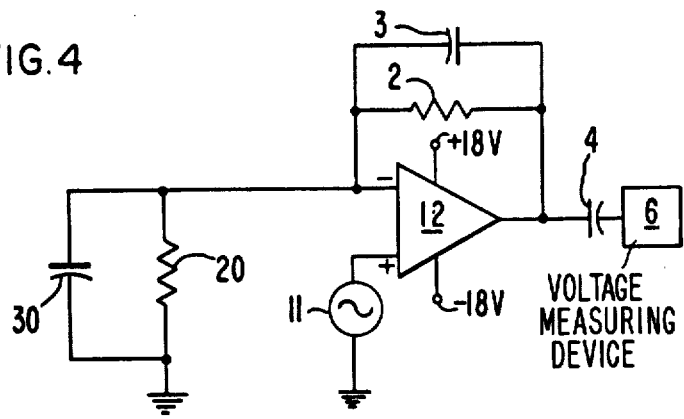
FIG. 4 is the alternating current equivalent circuit of the circuit depicted in FIG. 3.

FIG. 1a is a schematic illustration of the parallel RC model of the two-port device that we wish to measure. It is assumed that any inductance within the device is insubstantial. Therefore, the device can be uniquely modeled as the parallel combination of resistance 20 and capacitance 30 as illustrated in FIG. 1a.

FIG. 1b illustrates the special case where the two-port device to be measured is a photovoltaic diode. Such a diode may be uniquely modeled as three constituent components connected in parallel. The first is d.c. current source 10. This is representative of the short circuit current which flows through the diode and results from the incident radiation which impinges upon said diode. Next is resistance 20, and finally there is capacitance 30, each connected in parallel across current source 10. The values of resistance 20 and capacitance 30 are dependent upon the operating or bias voltage at which the diode is employed. In a good diode, inductances are kept to a minimum and can therefore be disregarded in the model. In a non-photovoltaic diode the current, as represented by current source 10, is zero for a voltage of zero and thus FIG. 1a is applicable. Since FIG. 1b has more components than FIG. 1a, the photovoltaic diode will be used as the basis for the ensuing analysis, but it must be remembered that the present invention is capable of measuring the resistance and capacitance of any two-port device with insubstantial inductance. In a circuit topology sense, FIG. 1a is the special case of FIG. 1b where current source 10 is zero.

FIG. 2 is an illustration of the family of current-voltage curves which define the operating characteristics of a typical photovoltaic diode. Each curve represents a different level of incident radiation for a given photodiode. Three such curves are shown in FIG. 2 but it must be remembered that this family of curves is continuous and thus an infinite number of curves could be shown.

These curves are roughly parallel to each other in their horizontal portion, while being identical throughout most of their vertical travel. The quiescent operating point of the diode at a given level of incident radiation is defined as that point where the voltage is 0, i.e., a point along the Y, or current, axis. For a typical photodiode, the current for a zero voltage condition might well be $-10$ micro-amperes for a certain level of incident radiation, as is illustrated by the middle curve. For this level of radiation it would take a voltage of 100 millivolts to bring the current to 0. This is known as the open circuit voltage. If the level of incident radiation were increased, the absolute value of the current at zero volts would be greater than 10 micro-amperes. For a non-photovoltaic diode there is but one curve, which passes through the origin, since for a zero voltage condition no current flows through the device. The dynamic impedance of the device is the impedance of the device at $V=0$ and can be visualized as the inverse of the slope of the I-V curve at the intersection of that curve with the I-axis; since all the I-V curves are roughly parallel within the incident radiation band of interest, the dynamic impedance is not a function of the particular I-V curve chosen. The junction capacitance of the photovoltaic diode is defined as the capacitance of the device at $V=0$. This parameter is also independent of incident radiation over the radiation band of interest.

FIG. 3 shows the circuit diagram of the present invention in a simple embodiment. The device under test 5 is connected to the negative input terminal of operational amplifier 12, which is connected as a non-inverting op amp with negative feedback. The end of device 5 which is not connected to said terminal is connected to ground. A typical op amp useful in the present invention is a $\mu$A 741. The power supply terminals of the op amp are connected to a power supply source providing $+18$ and $-18$ volts d.c. The output of an audio frequency A.C. oscillator 11 (which is an alternating voltage oscillator capable of operation from around zero Hz to about 25 KHz) is connected to the positive input terminal of op amp 12.

The terminal of oscillator 11 which is not connected to said terminal is connected to ground. Optionally, there can be a variable d.c. bias voltage source 9 connected between audio oscillator 11 and ground which enables one to perform measurements of device 5 at other voltages besides zero. In the case where device 5 is a photodiode, this permits one to measure impedances other than dynamic impedance and capacitances other than junction capacitance, whereas without DC voltage source 9 inserted in the system, the invention measures the capacitance and impedance of the diode at a point where the I-V curve crosses the I axis, i.e., the junction capacitance and dynamic impedance.

Between the negative input terminal and the output terminal of op amp 12 are connected two devices in parallel. The first is resistor 2, which is a known resistance and in the preferred embodiment is 1.4 Megohms. Capacitor 3 is a known capacitance connected in parallel with resistor 2 and in the preferred embodiment is 68 picofarads. Connected to the output terminal of op amp 12 is a voltage measuring device 6, which can be any device capable of measuring alternating voltage, such as an RMS meter. DC blocking capacitor 4 is inserted between the output of op amp 12 and measuring device 6 to prevent DC from entering device 6. Such DC is generated in small amounts by op amp 12 and in potentially large amounts by source 10 in the case where device 5 is a photodiode. The result is that meter 6 measures the output of the AC equivalent circuit to the FIG. 3 circuit, which is illustrated as FIG. 4.

Figure 5:
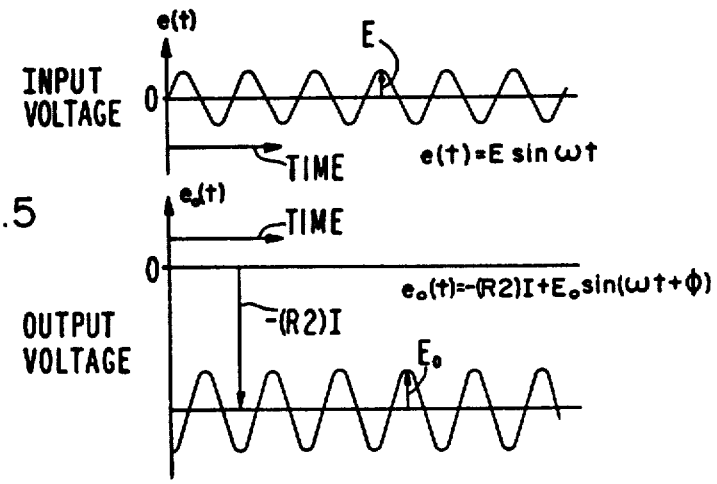
FIG. 5 illustrates the input and output sinusoids at the terminals of operational amplifier 12 of FIG. 4.

FIG. 5 shows the input and output voltage waveforms appearing on op amp 12; they are sinusoids. The first waveform illustrates the waveform which is applied to the positive input terminal of op amp 12. Since there is no potential difference across the op amp input terminals, this waveform also appears on the negative input terminal of op amp 12. The mathematical expression for said waveform is $e(t) = E \sin(\omega t)$, where E is the voltage maximum.

The second waveform of FIG. 5 illustrates the voltage waveform appearing on the output terminal of op amp 12. It differs from the input voltage waveform in three respects. First, there is the DC offset, which is $-(R2)I$. Secondly, the maximum amplitude of the variable component is $E_o$. Thirdly, there is a phase difference $\phi$ which distinguishes it from the input voltage. Since the measurement and calculation of capacitance 30 and resistance 20 are based on AC measurements of the input voltage and output voltage (the DC current generated by the photovoltaic detector merely biasing the output down by $-(R2)I$, the present device is very accurate. Most commercially available capacitance bridges of the prior art exhibit large measurement errors when measuring junction capacitance of photovoltaic diodes, due to the DC current generated by the diode.

When device 5 is a photovoltaic diode, the amplitude of AC oscillator 11 should be less than or equal to 20 mV RMS. The reason for this becomes apparent from the I-V curve for the diode shown in FIG. 2. From this curve, one can see that above 50 mV RMS, the diode begins to conduct heavily in the forward direction, which might saturate op amp 12 in the positive direction.

The following shows how one obtains expressions for the resistance 20 and capacitance 30:

As is well known, the gain for an op amp such as 12 in a non-inverting configuration is given by:

$$E_o/E = 1 + Z_1/Z$$

where $Z_1$ is the impedance of the parallel connection of R2 and C3, and Z is the impedance of the parallel connection of R20 and C30. Thus the gain can be represented as:

$$\frac{E_o}{E} = 1 + \left[\frac{\frac{R2/SC3}{R2 + \frac{1}{SC3}}}{\frac{R20/SC30}{R20 + 1/SC30}}\right] =$$

$$1 + \left(\frac{R2}{R2SC3 + 1}\right) \times \left(\frac{R20SC30 + 1}{R20}\right)$$

where S is the complex frequency.
Rearranging:

$$\frac{E_o}{E} = \frac{\frac{1}{R2} + SC3 + \frac{1}{R20} + SC30}{\frac{1}{R2} + SC3}$$

Substituting $j\omega$ for S:

$$\frac{E_o}{E} = \frac{\frac{1}{R2} + C3j\omega + \frac{1}{R20} + C30j\omega}{\frac{1}{R2} + C3j\omega}$$

Multiplying numerator and denominator by the complex congugate of the denominator and rearranging, one gets the following expression:

$$\frac{E_o}{E} = \frac{\frac{1}{R2}\left(\frac{1}{R20} + \frac{1}{R2}\right) + (C3 + C30)C3\omega^2}{\frac{1}{(R2)^2} + (C3)^2\omega^2} + \quad (1)$$

$$j\frac{\left(\frac{\omega}{R2}\right)(C3 + C30) - (C3\omega)\left(\frac{1}{R2} + \frac{1}{R20}\right)}{\frac{1}{(R2)^2} + (C3)^2\omega^2}$$

Figure 6:
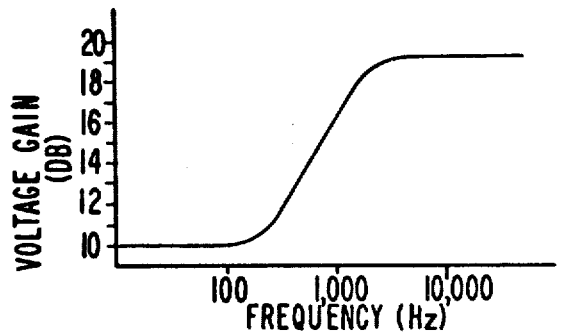
FIG. 6 is a graph in semi-logarithmic scale of the voltage gain in decibels of the circuit shown in FIG. 3 as a function of the frequency of the input voltage applied to the operational amplifier.

FIG. 6 is an empirically generated waveform of the voltage gain in decibels of the circuit of FIG. 3 as a function of frequency, plotted on a semilogarithmic scale. It is noted that this curve is flat for very low frequencies and also for very high frequencies; therefore, it is to be expected that if we take limits of the above equation (1) for $\omega$ going to zero and $\omega$ going to infinity we will obtain interesting results, which are justified by the empirical evidence as shown in FIG. 6 Thus, when we take the limit of equation (1) as $\omega$ goes to zero we obtain:

$$\lim_{\omega \to o} \frac{E_o}{E} = \frac{\frac{1}{(R2)}\left(\frac{1}{R20} + \frac{1}{R2}\right)}{\frac{1}{(R2)^2}} = \frac{R2}{R20} + 1$$

In other words, resistance $20 = R2/(E_o/E - 1)$ for low $\omega$.

We multiply the numerator and denominator of equation (1) by $1/\omega^2$ and obtain:

$$\frac{E_o}{E} = \frac{\frac{1}{R2\omega^2}\left(\frac{1}{R20} + \frac{1}{R2}\right) + (C3 + C30)C3}{\frac{1}{(R2)^2\omega^2} + (C3)^2} +$$

$$j\frac{\left(\frac{1}{R2\omega}\right)(C3 + C30) - \left(\frac{C3}{\omega}\right)\left(\frac{1}{R2} + \frac{1}{R20}\right)}{\frac{1}{(R2)^2\omega^2} + (C3)^2}$$

Taking the limit of this as $\omega$ goes to infinity we obtain:

$$\lim_{\omega \to \infty} \frac{E_o}{E} = 1 + \frac{C30}{C3}$$

Or, $$\text{capacitance } 30 = C3\left(\frac{E_o}{E} - 1\right)$$

for high $\omega$.

The expression for the resistance 20 is expected to be valid for frequencies that are less than about 70 Hz; the expression for capacitance 30 is expected to be valid for frequencies in excess of about 10 KHz.

C3 and R2 can be accurately and simply measured initially with, e.g., a capacitance/resistance bridge. E can be accurately measured with a digital RMS meter that ignores dc voltage. The output voltage $E_o$ is measured at a low frequency such as 70 Hz or lower when one wishes to measure the resistance 20, and is measured at a high frequency (e.g., greater than 10 KHz) when one wishes to measure capacitance 30. The measured values are then calculated.

Figure 7:
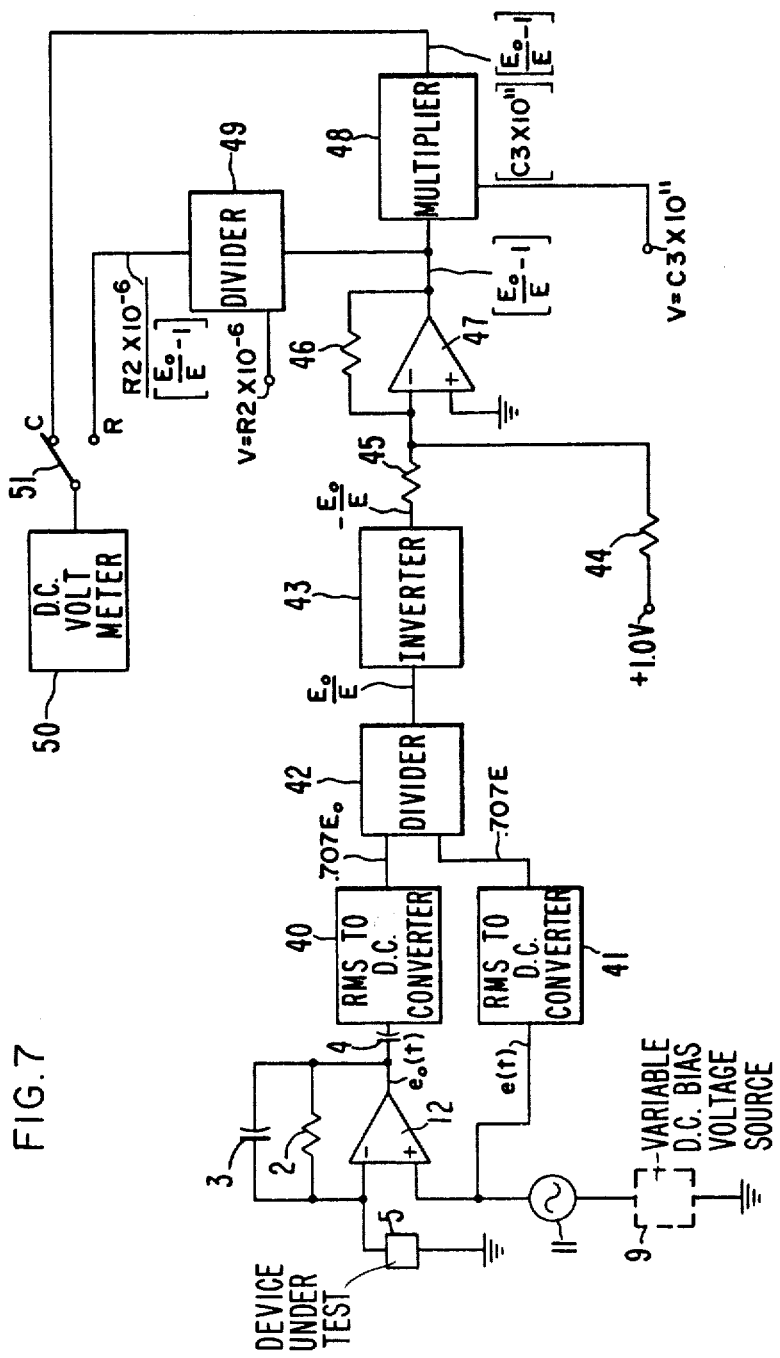
FIG. 7 is a schematic diagram of a circuit which is capable of providing a direct digital reading of both the resistance and capacitance of the device under test.

Alternative to calculating the measured values, they can be automatically projected on an output display device such as the LED's of a digital voltmeter by hard wiring a circuit to accomplish this function. Such a circuit is shown in FIG. 7. The device under test is shown as 5; in the case where it is a diode, its cathode is connected to ground and its anode is connected to the negative terminal of op amp 12. The positive input terminal of op amp 12 is connected to one end of audio oscillator 11, the other end of which is connected either to ground or to optional variable dc bias voltage source 9, which is employed when one wishes to measure the characteristics of the device 5 at a voltage other than V equals 0, e.g., when device 5 is a photodiode. In such a case, the other end of voltage source 9 is connected to ground. Resistor 2 and capacitor 3 are each connected in parallel across the negative input terminal of op amp 12 and the output terminal of op amp 12. The voltage appearing at the output terminal of op amp 12 is $e_o(t)$. This terminal is then connected to RMS-to-DC converter 40, which produces at its output a d.c. voltage equal to $0.707E_o$, which represents the RMS value of its input voltage. Similarly, RMS-to-DC converter 41 is connected to the positive input terminal of op amp 12 at which appears the alternating voltage $e(t)$. Converter 41 changes this to a d.c. voltage equal to $0.707E$, which represents the RMS value of its input voltage. The output of converter 40 and the output of converter 41 are each connected to the input of divider 42, which can be an analog or digital divider. Divider 42 divides these quantities, and thus the value of the voltage appearing at its output terminal is $E_o/E$. The output of divider 42 is connected to the input of inverter 43, which produces at its output terminal a voltage equal to $-E_o/E$. The output of the inverter 43 is connected through resistor 45 to the negative input terminal of op amp 47, which is connected in adding inverting connection. The positive input terminal of op amp 47 is connected to ground. Connected between the negative input terminal of op amp 47 and the output terminal of op amp 47 is resistor 46. Also connected to the negative input terminal of op amp 47 is resistor 44, the other end of which is connected to a one volt source of direct current. The values of resistors 44, 45 and 46 should be the same, and in the typical preferred embodiment are each 10,000 ohms. When the circuit is connected in this fashion, the d.c. output voltage appearing at the output terminal of op amp 47 is $(E_o/E) - 1$. This adding inverting function can also be done digitally.

The output terminal of op amp 47 is connected to the input of divider 49, which can be an analog or digital divider, and to the input of multiplier 48, which can be an analog or digital multiplier. A second input terminal of multiplier 48 is connected to a voltage source whose voltage is set equal to the capacitance of capacitor 3, multiplied by $10^{11}$ so as to scale this value to a number that is between 1 and 10, for the sake of convenience. Thus, the value of the voltage appearing at the output of multiplier 48 is equal to $(C3 \times 10^{11}) \times [(E_o/E) - 1]$. The output of multiplier 48 is connected to terminal C of single-pole double-throw switch 51, the common terminal of which is connected to d.c. digital voltmeter 50, typically having a LED or other visual display. A second input terminal of divider 49, which represents the numerator, is connected to a voltage source whose voltage is set equal to the value of the resistance of resistor 2 multiplied by $10^{-6}$ so as to scale this value to a number which is between 1 and 10, for the sake of convenience. Thus the voltage appearing at the output terminal of divider 49 is $R2 \times 10^{-6} \div [(E_o/E) - 1]$. The output of divider 49 is connected to the R terminal of switch 51.

Thus, it is seen that when the operator wishes to have a direct visual reading of resistance 20, he simply throws switch 51 to the R position and digital voltmeter 50 will graphically display the value of said resistance multiplied by the scale factor $10^{-6}$. Thus, multiplying the displayed value by $10^6$ will give the actual value of resistance 20. Alternatively, when the operator wishes directly to display capacitance 30, he simply switches switch 51 to the C position and digital voltmeter 50 automatically and graphically portrays the value of said capacitance multiplied by the scale factor of $10^{11}$. The actual value of capacitance 30 is equal to the displayed value multiplied by $10^{-11}$.

The above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. An apparatus for providing a direct visual reading of the values of the resistance and capacitance of the parallel resistive/capacitive circuit equivalent to any substantially non-inductive two-port device, comprising:

an a.c. oscillator referenced to ground;

a first operational amplifier having an inverting input terminal coupled to the first port of said device (the second port of the device being coupled to ground), a non-inverting input terminal coupled to the output of the a.c. oscillator, and an output terminal;

a known resistance and a known capacitance each coupled between the inverting and output terminals of said first amplifier;

a first a.c. to d.c. converter having a first terminal coupled to the output terminal of said first amplifier;

a second a.c. to d.c. converter having a first terminal coupled to the positive terminal of said first amplifier;

a first divider having first and second input terminals coupled to output terminals of each of said two converters, respectively;

an inverter having an input terminal coupled to an output terminal of the first divider;

a multiplier; a second divider;

a second amplifier having a first input coupled to an output of said inverter, and having an output coupled to a first terminal of the second divider and to a first terminal of the multiplier; and a d.c. voltmeter switchably coupled to an output of the second divider (in order to measure the resistance of the two-port device) and to an output of the multiplier (in order to measure the capacitance of the two-port device).

* * * * *